(12) United States Patent
Liu et al.

(10) Patent No.: US 9,379,754 B2
(45) Date of Patent: Jun. 28, 2016

(54) RADIO FREQUENCY CHANNEL

(71) Applicant: Huawei Technologies Co., Ltd., Shenzhen, Guangdong (CN)

(72) Inventors: Zhigang Liu, Beijing (CN); Shutian Yuan, Shenzhen (CN); Zhenyu Liu, Beijing (CN); Liqian Wang, Shenzhen (CN); Shanqing Zeng, Shenzhen (CN); Jian Sun, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/582,708

(22) Filed: Dec. 24, 2014

(65) Prior Publication Data

US 2015/0244404 A1    Aug. 27, 2015

(30) Foreign Application Priority Data

Feb. 27, 2014    (CN) .......................... 2014 1 0069708

(51) Int. Cl.

| H04B 1/38 | (2015.01) |
|---|---|
| H04B 1/16 | (2006.01) |
| H04B 1/00 | (2006.01) |
| H04L 27/26 | (2006.01) |
| H03G 3/30 | (2006.01) |
| H04L 5/00 | (2006.01) |
| H04B 1/02 | (2006.01) |

(52) U.S. Cl.
CPC ............... *H04B 1/16* (2013.01); *H03G 3/3036* (2013.01); *H04B 1/006* (2013.01); *H04L 5/00* (2013.01); *H04L 27/2647* (2013.01)

(58) Field of Classification Search
CPC ...... H04W 88/06; H04B 1/0057; H04B 1/006
USPC ......................................... 455/73, 132, 553.1
See application file for complete search history.

(56) References Cited

U.S. PATENT DOCUMENTS

| 2010/0220636 A1* | 9/2010 | Chan .................... H04B 1/0057 370/277 |
|---|---|---|
| 2012/0294299 A1 | 11/2012 | Fernando |
| 2013/0051284 A1 | 2/2013 | Khlat |
| 2014/0087670 A1 | 3/2014 | Bai |

FOREIGN PATENT DOCUMENTS

| CN | 202565228 U | 11/2008 |
|---|---|---|
| CN | 101425816 A | 5/2009 |
| CN | 201674474 U | 12/2010 |

(Continued)

*Primary Examiner* — Lee Nguyen

(74) *Attorney, Agent, or Firm* — Leydig, Voit & Mayer, Ltd.

(57) ABSTRACT

The present invention provides a radio frequency channel, including: a first antenna, a low noise amplifier, a power divider, at least two first single-pole, n-throw switches, at least four first filters, and at least two first radio frequency chips. The power divider divides a received radio frequency signal into two first radio frequency sub-signals, and transmits the two first radio frequency sub-signals to the at least four first filters, where the at least four first filters correspond to at least four filtering bands and the at least four first filters may cover frequency bands involved in at least six carrier aggregation CA technologies, the at least four first filters filter the first radio frequency sub-signals, and the at least two first radio frequency chips process the filtered first radio frequency sub-signals.

18 Claims, 12 Drawing Sheets

(56) References Cited

FOREIGN PATENT DOCUMENTS

| | | |
|---|---|---|
| CN | 201928273 U | 8/2011 |
| CN | 102510297 A | 6/2012 |
| CN | 102404879 A | 3/2014 |
| WO | WO 9925075 A2 | 5/1999 |
| WO | WO 03090370 A1 | 10/2003 |

* cited by examiner

RADIO FREQUENCY CHANNEL

CROSS-REFERENCE TO RELATED APPLICATION

This application claims priority to Chinese Patent Application No. 201410069708.2, filed on Feb. 27, 2014, which is hereby incorporated by reference in its entirety.

TECHNICAL FIELD

Embodiments of the present invention relate to communications technologies, and in particular, to a radio frequency channel.

BACKGROUND

Long Term Evolution (LTE for short) is long term evolution of a universal mobile telecommunications system (Universal Mobile Telecommunications System, UMTS for short) technological standard formulated by the 3rd Generation Partnership Project (3rd Generation Partnership Project, 3GPP for short).

According to different duplex modes, LTE is classified into two types: frequency division duplex (Frequency Division Duplex, FDD for short) and time division duplex (Time Division Duplex, TDD for short). In the FDD mode, uplink and downlink link channels use different frequencies, and a frame of a fixed time length is used during both uplink and downlink transmission. In the TDD mode, uplink and downlink links share a same frequency, and transmission is performed in different timeslots.

According to different carrier combination manners used by a terminal, carrier aggregation (Carrier Aggregation, CA for short) is classified into three types: intra-band continuous CA, intra-band non-continuous CA, and inter-frequency band CA. Frequency resources in global markets are different from each other, and different types of CA have respective application scenarios. The three different types of CA are included in both the FDD mode and the TDD mode. Therefore, a total of six types of CA in the FDD mode and the TDD mode need to be implemented by using different radio frequency front-end hardware architectures.

According to a demand of an actual application scenario, it is required that a terminal support a total of six CA technologies. However, an existing terminal cannot very well support a total of six or even more CA technologies that may be combined, and therefore design of the existing terminal is insufficiently flexible.

SUMMARY

Embodiments of the present invention provide a radio frequency channel, so that a terminal can flexibly support multiple CA technologies.

According to a first aspect, the present invention provides a radio frequency channel, including: a first antenna, a low noise amplifier, a power divider, at least two first single-pole, n-throw switches, at least four first filters, and at least two first radio frequency chips, where each of the at least four first filters corresponds to a filtering band;

the first antenna receives a first radio frequency signal and transmits the first radio frequency signal to the low noise amplifier;

the low noise amplifier amplifies the first radio frequency signal and transmits the amplified first radio frequency signal to the power divider;

the power divider divides the amplified first radio frequency signal into at least two first radio frequency sub-signals, and separately transmits each of the first radio frequency sub-signals to one of the at least two first single-pole, n-throw switches, where the at least two first single-pole, n-throw switches are characterized by single-input multi-output;

each of the at least two first single-pole, n-throw switches connects the received first radio frequency sub-signal to at least two of the at least four first filters;

the at least two first filters filter received first radio frequency sub-signals to obtain at least two filtered first radio frequency sub-signals, and transmit the at least two filtered first radio frequency sub-signals to one of the at least two first radio frequency chips; and the one of the at least two first radio frequency chips demodulates the at least two filtered first radio frequency sub-signals.

In a first possible implementation manner, with reference to the first aspect, the radio frequency channel further includes: at least two second single-pole, n-throw switches and at least two third single-pole, n-throw switches;

the at least two first filters transmit the at least two filtered first radio frequency sub-signals to one of the at least two second single-pole, n-throw switch, and the at least two second single-pole, n-throw switches are characterized by multi-input single-output;

the one of the at least two second single-pole, n-throw switches connects the at least two filtered first radio frequency sub-signals to one of the at least two third single-pole, n-throw switches, and the at least two third single-pole, n-throw switches are characterized by single-input multi-output; and the one of the at least two third single-pole, n-throw switches transmits received first radio frequency sub-signals to one of the at least two first radio frequency chips.

In a second possible implementation manner, with reference to the first aspect or the first possible implementation manner of the first aspect, each of the first single-pole, n-throw switches and the at least two first filters corresponding to the first single-pole, n-throw switch are integrally set.

In a third possible implementation manner, with reference to the first aspect, the first or second possible implementation manner of the first aspect, the radio frequency channel further includes: a second antenna, a fourth single-pole, n-throw switch, at least two second filters, at least two first power amplifiers, and at least two second radio frequency chips, where each of the at least two second filters corresponds to a filtering band;

the at least two second radio frequency chips modulate a first analog baseband or intermediate-frequency signal into at least two second radio frequency signals, and respectively transmit the at least two second radio frequency signals to the at least two first power amplifiers;

the at least two first power amplifiers amplify the at least two second radio frequency signals to obtain at least two amplified second radio frequency signals, and transmit the at least two amplified second radio frequency signals to the at least two second filters;

the at least two second filters filter the at least two amplified second radio frequency signals to obtain at least two filtered second radio frequency signals, and transmit the at least two filtered second radio frequency signals to the fourth single-pole, n-throw switch; and the fourth single-pole, n-throw switch connects the at least two filtered second radio frequency signals to the second antenna.

In a fourth possible implementation manner, with reference to the first aspect, the first or second possible implementation manner of the first aspect, the radio frequency channel further includes: a circulator, a fourth single-pole, n-throw switch, at least two second filters, at least two first power amplifiers, and at least two second radio frequency chips, where each of the at least two second filters corresponds to a filtering band;

the circulator is disposed between the first antenna and the low noise amplifier;

the at least two second radio frequency chips modulate a first analog baseband or intermediate-frequency signal into at least two second radio frequency signals, and transmit the at least two second radio frequency signals to the at least two first power amplifiers;

the at least two first power amplifiers amplify the at least two second radio frequency signals to obtain at least two amplified second radio frequency signals, and transmit the at least two amplified second radio frequency signals to the at least two second filters;

the at least two second filters filter the at least two amplified second radio frequency signals to obtain at least two filtered second radio frequency signals, and transmit the at least two filtered second radio frequency signals to the fourth single-pole, n-throw switch;

the fourth single-pole, n-throw switch connects the at least two filtered second radio frequency signals to the first antenna by using the circulator; and the first antenna receives the first radio frequency signal and transmits the first radio frequency signal to the low noise amplifier by using the circulator.

In a fifth possible implementation manner, with reference to the first aspect, the first, second, third, or fourth possible implementation manner of the first aspect, the radio frequency channel further includes: a third filter, a fourth filter, a second power amplifier, a fifth single-pole, n-throw switch, and a third radio frequency chip;

the fifth single-pole, n-throw switch receives a third radio frequency signal transmitted by the first antenna, and connects the third radio frequency signal to the third filter;

the third filter filters the third radio frequency signal and transmits the filtered third radio frequency signal to the third radio frequency chip;

the third radio frequency chip demodulates the filtered third radio frequency signal;

the third radio frequency chip modulates a second analog baseband or intermediate-frequency signal into a fourth radio frequency signal, and transmits the fourth radio frequency signal to the second power amplifier;

the second power amplifier amplifies the fourth radio frequency signal to obtain the amplified fourth radio frequency signal, and transmits the amplified fourth radio frequency signal to the fourth filter;

the fourth filter filters the fourth radio frequency signal and transmits the filtered fourth radio frequency signal to the fifth single-pole, n-throw switch; and the fifth single-pole, n-throw switch connects the filtered fourth radio frequency signal to the first antenna.

In a sixth possible implementation manner, with reference to the first aspect, the first, second, third, fourth, or fifth possible implementation manner of the first aspect, the radio frequency channel further includes: a baseband processing unit, coupled to each of the first radio frequency chips, and configured to process a baseband or intermediate-frequency signal generated after each of the first radio frequency chips performs demodulation.

In a seventh possible implementation manner, with reference to the sixth possible implementation manner of the first aspect, the baseband processing unit is further configured to generate a control signal of the first single-pole, n-throw switches to control connection or switching-off of each of the first single-pole, n-throw switches.

In an eighth possible implementation manner, with reference to the first aspect, the first, second, third, fourth, fifth, sixth, or seventh possible implementation manner of the first aspect, each of the first radio frequency chips includes: a down-converter for signal demodulation.

In a ninth possible implementation manner, with reference to the third or fourth possible implementation manner of the first aspect, each of the second radio frequency chips includes: an up-converter for signal modulation.

According to the radio frequency channel provided in the embodiments of the present invention, a power divider divides a received radio frequency signal into two first radio frequency sub-signals, and transmits the two first radio frequency sub-signals to at least four first filters, where the at least four first filters correspond to at least four filtering bands, and the at least four first filters may cover frequency bands involved in at least six CA technologies; the at least four first filters filter the first radio frequency sub-signals, and at least two first radio frequency chips process the filtered first radio frequency sub-signals, so that the radio frequency channel can support CA technologies of multiple combinations, and flexibility of the radio frequency channel is improved.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show some embodiments of the present invention, and persons of ordinary skill in the art may still derive other drawings from these accompanying drawings without creative efforts.

DESCRIPTION OF EMBODIMENTS

Figure 1:
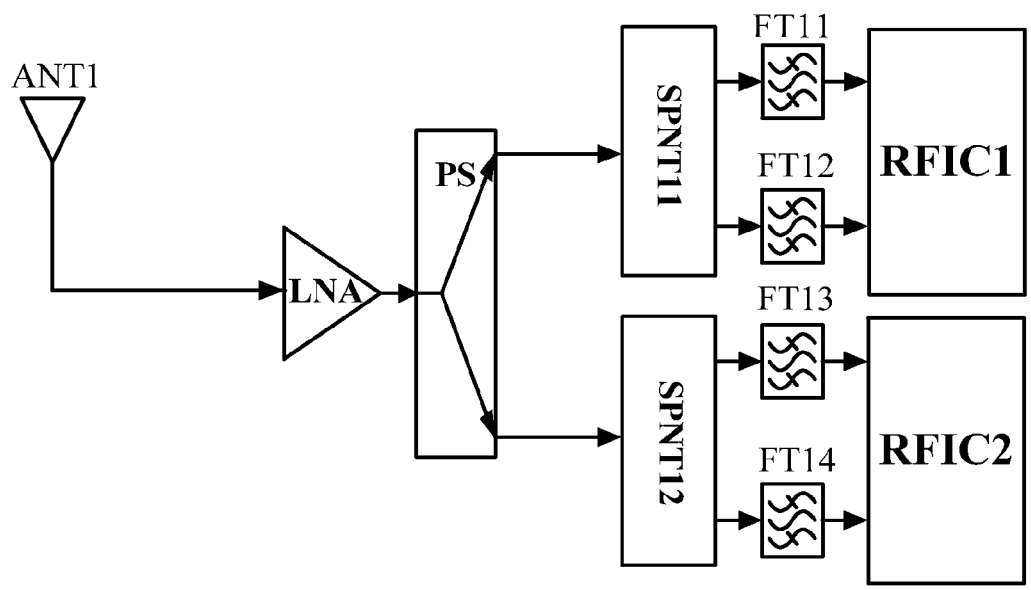
FIG. 1 is a schematic structural diagram of Embodiment 1 of a radio frequency channel according to the present invention.

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are a part rather than all of the embodiments of the present invention. All other embodiments obtained by persons of ordinary skill in the art based on the embodiments of the present invention without creative efforts shall fall within the protection scope of the present invention.

To conveniently describe embodiments of a radio frequency channel of the present invention, technical terms are explained.

A radio frequency channel is a link for processing a radio frequency signal, and the link may include multiple electronic components, and may optionally include any one of the following components, but is not limited to the following components:

an antenna (Antenna, ANT for short), which receives a radio frequency signal from a radio channel during receiving and transmits a radio frequency signal to a radio channel during transmission;

a low noise amplifier (Low Noise Amplifier, LNA for short), which is mainly used to amplify power of a received radio frequency signal, reduce a noise coefficient of a radio frequency channel, and improve a receive sensitivity indicator;

a power divider (Power divider, PS for short), which is characterized by single-input two-output, and divides power of a radio frequency signal evenly into two branches;

a single-pole, n-throw switch (Single-pole, n-throw, SPNT for short), which is characterized by single-input N-output or N-input single-output, and is used to connect a radio frequency signal to one of N channels;

a power amplifier (Power Amplifier, PA for short), which is mainly used to amplify power of a radio frequency signal, where a PA of a corresponding frequency band needs to be used according to an LTE frequency band demanded by a system; and a radio frequency integrated circuit (Radio Frequency Integrated Circuit, RFIC for short), which may also be referred to as a radio frequency chip, where according to different configurations of an internal register of the RFIC, the RFIC can modulate and demodulate LTE signals of different frequency bands, for example, convert a radio frequency signal into an analog baseband/intermediate-frequency signal or convert an analog baseband/intermediate-frequency signal into a radio frequency signal, and in this patent, a symbol "/" indicates "or" in logic.

In addition, this patent may further involve the following concepts:

transmit (Transmit, TX for short), which is mainly used to modulate an analog baseband/intermediate-frequency signal into a radio frequency signal;

primary receive (Primary Receive, PRX for short), which is mainly used to demodulate a radio frequency signal received by a primary antenna into an analog baseband/intermediate-frequency signal;

diversity receive (Diversity Receive, DRX for short), which is mainly used to demodulate a radio frequency signal received by a diversity antenna into an analog baseband/intermediate-frequency signal;

a surface acoustic wave (surface acoustic wave, SAW for short) filter (filter, FT for short), where according to an LTE frequency band demanded by a system, a SAW filter of a corresponding frequency band needs to be used for filtering; and a circulator (Circulator, CL for short), which is characterized by forward conduction and reverse isolation.

FIG. 1 is a schematic structural diagram of Embodiment 1 of a radio frequency channel according to the present invention. The radio frequency channel may be a primary receive channel or a diversity receive channel. As shown in FIG. 1, the radio frequency channel includes a first antenna (ANT1), a low noise amplifier (LNA), a power divider (PS), two first single-pole, n-throw switches (SPNT11 and SPNT12), four first filters (FT11, FT12, FT13, and FT14), and two first radio frequency chips (RIFC1 and RIFC2), where each first filter of the four first filters corresponds to a filtering band; and the first filters may be SAW filters. The first antenna (ANT1) receives a first radio frequency signal and transmits the first radio frequency signal to the low noise amplifier (LNA); the low noise amplifier (LNA) amplifies the first radio frequency signal and transmits the amplified first radio frequency signal to the power divider (PS); the power divider (PS) divides the first radio frequency signal into two first radio frequency sub-signals, and separately transmits each of the first radio frequency sub-signals to one of the two first single-pole, n-throw switches (SPNT11 and SPNT12), where the first single-pole, n-throw switches are characterized by single-input multi-output; the first single-pole, n-throw switches connect received first radio frequency sub-signals to the two first filters; the two first filters filter the received first radio frequency sub-signals to obtain two filtered first radio frequency sub-signals, and transmit the two filtered first radio frequency sub-signals to the first radio frequency chips; and the first radio frequency chips demodulate the two filtered first radio frequency sub-signals.

The SPNT11 is used as an example. The SPNT11 connects a first radio frequency sub-signal to the two first filters FT11 and FT12, the FT11 and the FT12 filter the first radio frequency sub-signal to obtain two filtered first radio frequency sub-signals, and transmit the two filtered first radio frequency sub-signals to the first radio frequency chip RIFC1, and the RIFC1 demodulates the two filtered first radio frequency sub-signals.

As stipulated by a 3GPP protocol, an LTE frequency is classified into an FDD frequency band and a TDD frequency band. The FDD frequency band includes band1 to band21, and the TDD frequency band includes band33 to band41.

A radio frequency signal of FDD intra-band continuous CA, a radio frequency signal of FDD intra-band non-continuous CA, and a radio frequency signal of FDD inter-band CA may at least occupy two frequency bands. For example, both the radio frequency signal of the FDD intra-band continuous CA and the radio frequency signal of the FDD intra-band non-continuous CA occupy band3, and the radio frequency signal of the FDD inter-band CA occupies band3 and band7. Persons skilled in the art may understand that the number of frequency bands occupied by the radio frequency signal of the FDD intra-band continuous CA, the radio frequency signal of the FDD intra-band non-continuous CA, and the radio frequency signal of the FDD inter-band CA may exceed two. A radio frequency signal of TDD intra-band continuous CA, a radio frequency signal of TDD intra-band non-continuous CA, and a radio frequency signal of TDD inter-band CA may at least occupy two frequency bands. For example, both the radio frequency signal of the TDD intra-band continuous CA and the radio frequency signal of the TDD intra-band non-continuous CA occupy band38, and the radio frequency signal of the TDD inter-band CA occupies band38 and band40. Persons skilled in the art may understand that the number of frequency bands occupied by the radio frequency signal of the TDD intra-band continuous CA, the radio frequency signal of the TDD intra-band non-continuous CA, and the radio frequency signal of the TDD inter-band CA may exceed two.

It can be known from the foregoing that if the radio frequency channel is to support six CA technologies, after the power divider on the radio frequency channel divides a radio frequency signal into radio frequency sub-signals, at least two filters are required to complete filtering for each of the radio frequency sub-signals. Specifically, on the radio frequency channel in this embodiment, after the power divider divides the first radio frequency signal into two first radio frequency sub-signals, two first filters are required to complete filtering for each of the first radio frequency sub-signals, which is used as an example.

For the six CA technologies, the following separately introduces working principles of the six CA technologies for the radio frequency channel in this embodiment.

For the radio frequency signal of the FDD intra-band continuous CA, a working principle of the radio frequency channel is that: the ANT1 receives the radio frequency signal of the FDD intra-band continuous CA and transmits the radio frequency signal to the LNA; the LNA amplifies the radio frequency signal and transmits the amplified radio frequency signal to the PS; the PS divides the radio frequency signal evenly into two first radio frequency sub-signals according to power; one of the first radio frequency sub-signals is connected to a first filter of a corresponding frequency band of the radio frequency signal by using the SPNT11, where a filtering band of the first filter is a frequency band corresponding to the radio frequency signal of the FDD intra-band continuous CA; the first radio frequency sub-signal is transmitted to the RIFC1 after out-of-band spur is filtered by the first filter; the RIFC1 demodulates the CA radio frequency signal, as a broadband radio frequency signal, into an analog baseband/intermediate-frequency signal; and the other first radio frequency sub-signal is not processed. In this working mode, the CA technology is mainly implemented by relying on a broadband processing capability of the RIFC1.

For the radio frequency signal of the TDD intra-band continuous CA, a working principle of the radio frequency channel is the same as the working principle of the radio frequency channel for the radio frequency signal of the FDD intra-band continuous CA. A difference lies in that, in this case, a filtering band of a first filter is a frequency band corresponding to the radio frequency signal of the TDD intra-band continuous CA.

For the radio frequency signal of the FDD intra-band non-continuous CA, a working principle of the radio frequency channel is that: the ANT1 receives the radio frequency signal of the FDD intra-band non-continuous CA and transmits the radio frequency signal to the LNA, the LNA amplifies the radio frequency signal and transmits the amplified radio frequency signal to the PS, and the PS divides the radio frequency signal evenly into two first radio frequency sub-signals according to power. One of the first radio frequency sub-signals is connected to a first filter of a corresponding frequency band of the radio frequency signal by using the SPNT11, and is transmitted to the RIFC1 after out-of-band spur is filtered by the first filter, and the RIFC1 demodulates a single-carrier signal in the radio frequency signal into an analog baseband/intermediate-frequency signal. The other first radio frequency sub-signal is connected to another first filter of a corresponding frequency band of the radio frequency signal by using the SPNT12, and is transmitted to the RIFC2 after out-of-band spur is filtered by the another first filter, and the RIFC2 demodulates another single-carrier signal in the radio frequency signal into an analog baseband/intermediate-frequency signal, where the first filter and the another first filter each correspond to one of the two corresponding frequency bands of the radio frequency signal of the FDD intra-band non-continuous CA.

For the radio frequency signal of the TDD intra-band non-continuous CA, a working principle of the radio frequency channel is the same as the working principle of the radio frequency channel for the radio frequency signal of the FDD intra-band non-continuous CA. A difference lies in that, a filtering band corresponding to a first filter is different, that is, in this case, the first filter corresponds to a frequency band corresponding to the radio frequency signal of the TDD intra-band non-continuous CA.

For the radio frequency signal of the FDD inter-band CA, a working principle of the radio frequency channel is the same as the working principle of the radio frequency channel for the radio frequency signal of the FDD intra-band non-continuous CA. A difference lies in that, in this case, a first filter corresponding to one first radio frequency sub-signal corresponds to a frequency band in the radio frequency signal of the FDD inter-band CA, and a first filter corresponding to the other first radio frequency sub-signal corresponds to another frequency band in the radio frequency signal of the FDD inter-band CA.

For the radio frequency signal of the TDD inter-band CA, a working principle of the radio frequency channel is the same as the working principle of the radio frequency channel for the radio frequency signal of the FDD inter-band CA. A difference lies in that, in this case, a first filter corresponding to one first radio frequency sub-signal corresponds to a frequency band in the radio frequency signal of the TDD inter-band CA, and a first filter corresponding to the other first radio frequency sub-signal corresponds to another frequency band in the radio frequency signal of the TDD inter-band CA.

In addition to the foregoing six CA technologies, the radio frequency channel provided in this embodiment may further support an FDD+TDD inter-band CA radio frequency signal technology. In this case, the radio frequency channel needs to use both a first filter for an FDD frequency band and a first filter for a TDD frequency band. Specifically, a first filter corresponding to one first radio frequency sub-signal corresponds to a radio frequency signal of the FDD frequency band, and a first filter corresponding to the other first radio frequency sub-signal corresponds to a radio frequency signal of the TDD frequency band, and the RIFC1 and the RIFC2 need to demodulate single-carrier radio frequency signals of different frequency bands. On the radio frequency channel described in this embodiment, a power divider divides a received radio frequency signal into two first radio frequency sub-signals, and transmits the two first radio frequency sub-signals to four first filters, where the four first filters correspond to four filtering bands, and the four first filters may cover frequency bands involved in the six CA technologies; the four first filters filter the first radio frequency sub-signals; and two first radio frequency chips process the filtered first radio frequency sub-signals, so that the radio frequency channel can support CA technologies of multiple combinations, and flexibility of the radio frequency channel is improved.

It should be noted that in this embodiment, an example in which there are two first single-pole, n-throw switches SPNT11 and SPNT12, each of the first single-pole, n-throw switches is connected to two first filters, and the two first filters correspond to a first radio frequency chip is used, which cannot be construed as a limitation on the number of first single-pole, n-throw switches, that of first filters, and that of first radio frequency chips in the present invention. The present invention is applicable to a scenario in which on the radio frequency channel, there are at least two first single-pole, n-throw switches, each of the first single-pole, n-throw switches is connected to at least two first filters, and the at least two first filters correspond to a first radio frequency chip.

Figure 2:
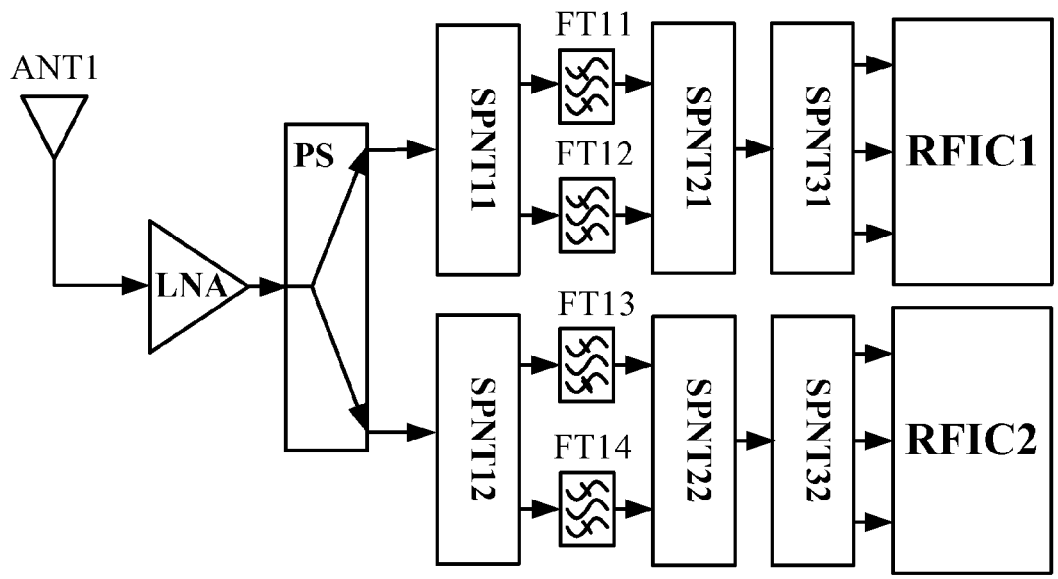
FIG. 2 is a schematic structural diagram of Embodiment 2 of a radio frequency channel according to the present invention.

FIG. 2 is a schematic structural diagram of Embodiment 2 of a radio frequency channel according to the present invention. This embodiment is applicable to a scenario in which the radio frequency channel supports a large number of frequency bands. As shown in FIG. 2, based on the embodiment of FIG. 1, this embodiment further includes: second single-pole, n-throw switches (SPNT21 and SPNT22) and third single-pole, n-throw switches (SPNT31 and SPNT32). The second single-pole, n-throw switches (SPNT21 and SPNT22) are disposed between the at least two first filters and the third single-pole, n-throw switches (SPNT31 and SPNT32). The third single-pole, n-throw switches (SPNT31 and SPNT32) are disposed between the second single-pole, n-throw switches (SPNT21 and SPNT22) and the first radio frequency chips (RIFC1 and RIFC2). The second single-pole, n-throw switches are characterized by multi-input single-output, and the third single-pole, n-throw switches are characterized by single-input multi-output. It should be noted that in the accompanying drawings of the present invention, an example in which the second single-pole, n-throw switches are characterized by single-input two-output or single-input three-output, and the third single-pole, n-throw switches are all characterized by single-input three-output is used, which cannot be construed as a limitation on the number of outputs of the second single-pole, n-throw switches and that of the third single-pole, n-throw switches.

The SPNT21 and the SPNT31 are used as an example. The SPNT21 is disposed between the two first filters (FT11 and FT12) and the SPNT31, and the SPNT31 is disposed between the SPNT21 and the RIFC1.

Specifically, on the radio frequency channel, after the PS divides a radio frequency signal into at least two first radio frequency sub-signals, for any of the first radio frequency sub-signals, the PS transmits the first radio frequency sub-signal to the first single-pole, n-throw switch SPNT11; the SPNT11 connects the first radio frequency sub-signal to the two first filters FT11 and FT12; the FT11 and the FT12 filter the first radio frequency sub-signal to obtain two filtered first radio frequency sub-signals, and transmit the two filtered first radio frequency sub-signals to the second single-pole, n-throw switch SPNT21; the second single-pole, n-throw switch SPNT21 connects the two filtered first radio frequency sub-signals to the third single-pole, n-throw switch SPNT31; and the third single-pole, n-throw switch SPNT31 transmits, according to a frequency band, multiple filtered first radio frequency sub-signals to a port corresponding to the first radio frequency chip RIFC1, for example, the third single-pole, n-throw switch transmits, according to three types: a low frequency, a high frequency, and an ultrahigh frequency, the multiple filtered first radio frequency sub-signals to a receive port corresponding to the RIFC1, and if frequency bands supported by the receive port of the RIFC1 are classified into two types: the low frequency and the high frequency, the third single-pole, n-throw switch needs to be replaced with a radio frequency switch characterized by single-input two-output. Therefore, which type of radio frequency switch is added behind a first filter is not limited in the present invention.

Figure 3:
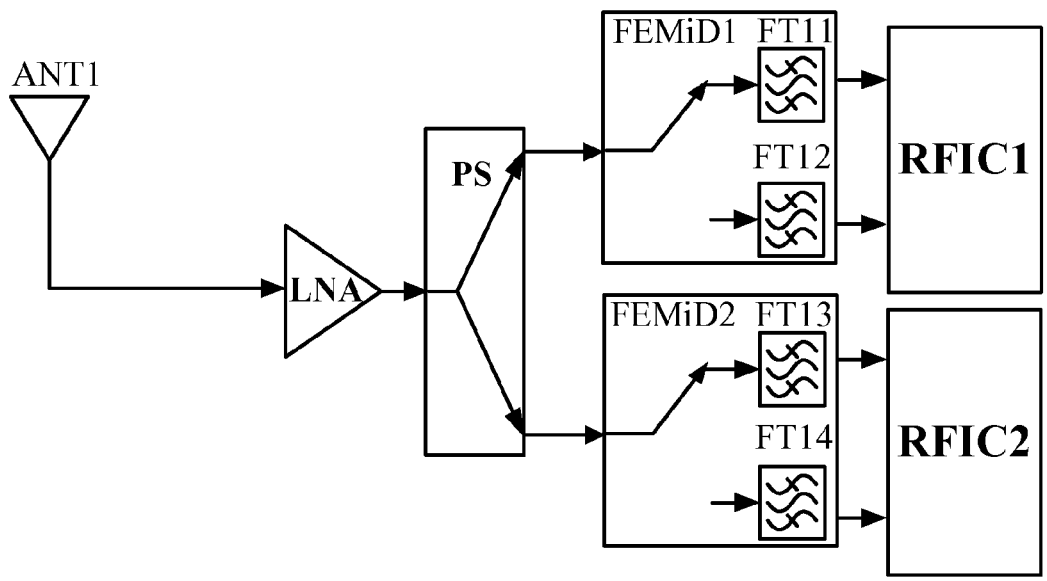
FIG. 3 is a schematic structural diagram of Embodiment 3 of a radio frequency channel according to the present invention.

FIG. 3 is a schematic structural diagram of Embodiment 3 of a radio frequency channel according to the present invention. As shown in FIG. 3, based on the embodiment of FIG. 1, in this embodiment, a first single-pole, n-throw switch and two first filters are integrally set. Integral setting may be integration by using an integrated circuit technique or placement in a hardware entity by using a packaging technique.

Specifically, a first single-pole, n-throw switch and two first filters corresponding to the first single-pole, n-throw switch may be jointly packaged into a front-end module with integrated duplexer (Front-end module with integrated duplexer, FEMiD for short), such as, an FEMiD1 and a FEMiD2 shown in FIG. 3. Compared with the embodiment of FIG. 1, the radio frequency channel in this embodiment is more highly integrated.

Figure 4:
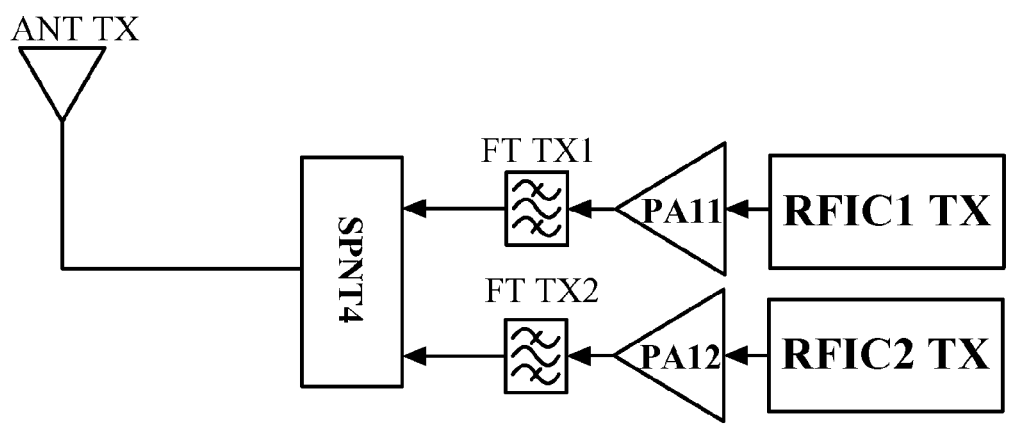
FIG. 4 is a schematic structural diagram of Embodiment 4 of a radio frequency channel according to the present invention.

FIG. 4 is a schematic structural diagram of Embodiment 4 of a radio frequency channel according to the present invention. Specifically, the radio frequency channel is a transmit channel, and the transmit channel includes:

a second antenna (ANT TX), a fourth single-pole, n-throw switch (SPNT4), two second filters (FT TX1 and FT TX2), two first power amplifiers (PA11 and PA12), and two second radio frequency chips (RFIC1 TX and RIFC2 TX);

the two second radio frequency chips (RFIC1 TX and RFCI2 TX) modulate a first analog baseband/intermediate-frequency signal into two second radio frequency signals, and transmit the two second radio frequency signals to the two first power amplifiers (PA11 and PA12);

the two first power amplifiers (PAH and PA12) amplify the second radio frequency signals to obtain two amplified second radio frequency signals, and transmit the two amplified second radio frequency signals to the two second filters (FT TX1 and FT TX2), where the two second filters each correspond to a filtering band;

the two second filters (FT TX1 and FT TX2) filter the two amplified second radio frequency signals to obtain two filtered second radio frequency signals, and transmit the two filtered second radio frequency signals to the fourth single-pole, n-throw switch (SPNT4); and the fourth single-pole, n-throw switch (SPNT4) connects the two filtered second radio frequency signals to the second antenna (ANT TX).

It should be noted that in this embodiment, two second filters, two first power amplifiers, and two second radio frequency chips are used only as an example, which cannot be construed as a limitation on the number of second filters, that of first power amplifiers, and that of second radio frequency chips in the present invention. The present invention is applicable to a scenario in which the number of second filters, that of first power amplifiers, and that of second radio frequency chips are all at least two.

The following introduces a working principle of the transmit channel in this embodiment. An LTE uplink radio frequency signal includes an LTE FDD radio frequency signal and an LTE TDD radio frequency signal. On the transmit channel in this embodiment, an uplink radio frequency signal to be transmitted at least includes radio frequency signals of two frequency bands, for example, a frequency band occupied by the LTE FDD radio frequency signal and a frequency band occupied by the LTE TDD radio frequency signal. Persons skilled in the art may understand that the number of frequency bands occupied by the LTE FDD radio frequency signal and the number of frequency bands occupied by the LTE TDD radio frequency signal may both exceed two.

It can be known from the foregoing that if the transmit channel is to support the LTE FDD radio frequency signal and the LTE TDD radio frequency signal, on the transmit channel, after the second radio frequency chips modulate a first analog baseband/intermediate-frequency signal into second radio frequency signals, at least two second filters are required to complete filtering for the second radio frequency signals. Specifically, on the transmit channel in this embodiment, two second radio frequency chips modulate a first analog baseband/intermediate-frequency signal into two second radio frequency signals, and one second filter is required to complete filtering for each of the second radio frequency signals, which is used as an example.

The following introduces a working process of the transmit channel from the perspective of a radio frequency signal supported by the transmit channel.

For the LTE FDD radio frequency signal, the FT TX1 on the transmit channel supports an FDD frequency band, and the FT TX2 on the transmit channel supports a TDD frequency band. According to an actual application scenario, the RFIC1 TX works, and the RFCI2 TX does not work. The RIFC1 TX modulates an analog baseband/intermediate-frequency signal into an LTE FDD radio frequency signal, the PA11 amplifies power of the radio frequency signal, the FT TX1 filters out-of-band spur, and the SPNT4 connects the LTE FDD radio frequency signal to the second antenna (ANT TX).

For the LTE TDD radio frequency signal, the FT TX1 on the transmit channel supports the FDD frequency band, and the FT TX2 on the transmit channel supports the TDD frequency band. According to an actual application scenario, the RIFC1 TX does not work, and the RFCI2 TX works. The RIFC2 TX modulates an analog baseband/intermediate-frequency signal into an LTE TDD radio frequency signal, the PA12 amplifies power of the radio frequency signal, the FT TX2 filters out-of-band spur, and the SPNT4 connects a transmission signal to the second antenna (ANT TX).

This transmit channel further implements a new LTE FDD+TDD hybrid radio frequency signal transmitting technology. Currently, no communications protocol supports an uplink CA radio frequency technology, and the FT TX1 and the FT TX2 each support one frequency band in the FDD frequency band and the TDD frequency band. According to an actual application scenario, one of the FT TX1 and the FT TX2 on the channel keeps working When the FT TX1 works, the RIFC1 TX1 modulates an analog baseband/intermediate-frequency signal into an LTE FDD radio frequency signal, the PA11 amplifies power of the radio frequency signal, the FT TX1 filters out-of-band spur, and the SPNT4 connects the LTE FDD radio frequency signal to the second antenna (ANT TX). When the FT TX2 works, the RIFC2 TX modulates an analog baseband/intermediate-frequency signal into an LTE TDD radio frequency signal, the PA12 amplifies power of the radio frequency signal, the FT TX2 filters out-of-band spur, and the SPNT4 connects a transmission signal to the second antenna (ANT TX).

Figure 5:
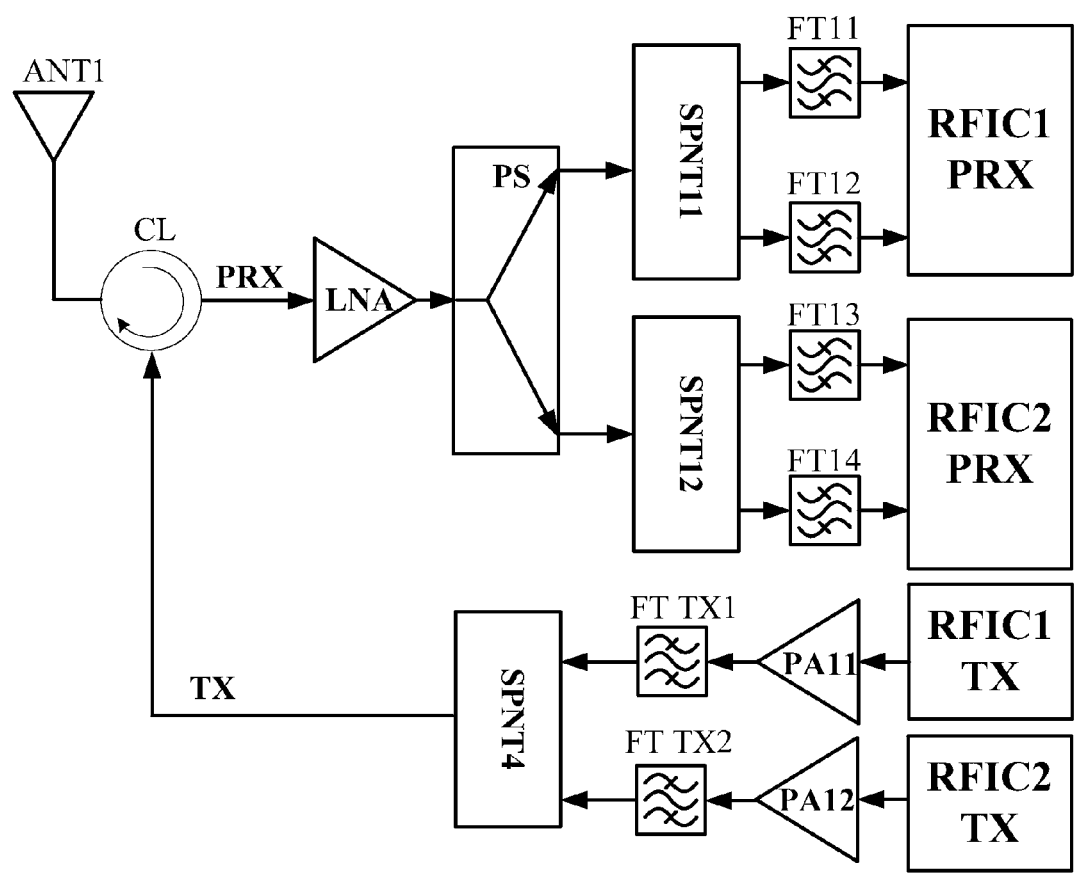
FIG. 5 is a schematic structural diagram of Embodiment 5 of a radio frequency channel according to the present invention.

It should be noted that when the radio frequency channel described in the embodiments corresponding to FIG. 1 to FIG. 3 is a receive channel, the receive channel described in the embodiments corresponding to FIG. 1 to FIG. 3 may be combined with the transmit channel described in this embodiment to form a radio frequency channel including a transmit channel and a receive channel. FIG. 5 is a schematic structural diagram of Embodiment 5 of a radio frequency channel according to the present invention. Based on the radio frequency channel described in FIG. 1, a transmit channel is added to this radio frequency channel. Specifically, based on the radio frequency channel described in FIG. 1, this radio frequency channel further includes: a circulator CL, a fourth single-pole, n-throw switch (SPNT4), two second filters (FT TX1 and FT TX2), two first power amplifiers (PA11 and PA12), and two second radio frequency chips (RIFC1 TX and RIFC2 TX), where each of the two second filters corresponds to a filtering band.

The circulator CL is disposed between the first antenna ANT1 and the low noise amplifier LNA.

The two second radio frequency chips modulate a first analog baseband or intermediate-frequency signal into two second radio frequency signals, and transmit the two second radio frequency signals to the two first power amplifiers.

The two first power amplifiers amplify the two second radio frequency signals to obtain two amplified second radio frequency signals, and transmit the two amplified second radio frequency signals to the two second filters.

The two second filters filter the two amplified second radio frequency signals to obtain two filtered second radio frequency signals, and transmit the two filtered second radio frequency signals to the fourth single-pole, n-throw switch.

The fourth single-pole, n-throw switch connects the two filtered second radio frequency signals to the first antenna by using the circulator.

The first antenna receives a first radio frequency signal and transmits the first radio frequency signal to the low noise amplifier by using the circulator.

Persons skilled in the art may understand that the receive channel involved in FIG. 5 may further be the receive channel described in FIG. 2 or FIG. 3. On the radio frequency channel described in this embodiment, a circulator is added to reduce the number of antennas, thereby reducing space of the radio frequency channel.

It should be noted that in this embodiment, an example in which there are two second filters, each of the filters corresponds to a first power amplifier, and each power amplifier corresponds to a second radio frequency chip is used, which cannot be construed as a limitation on the number of second filters, that of first power amplifiers, and that of second radio frequency chips in the present invention.

Figure 6:
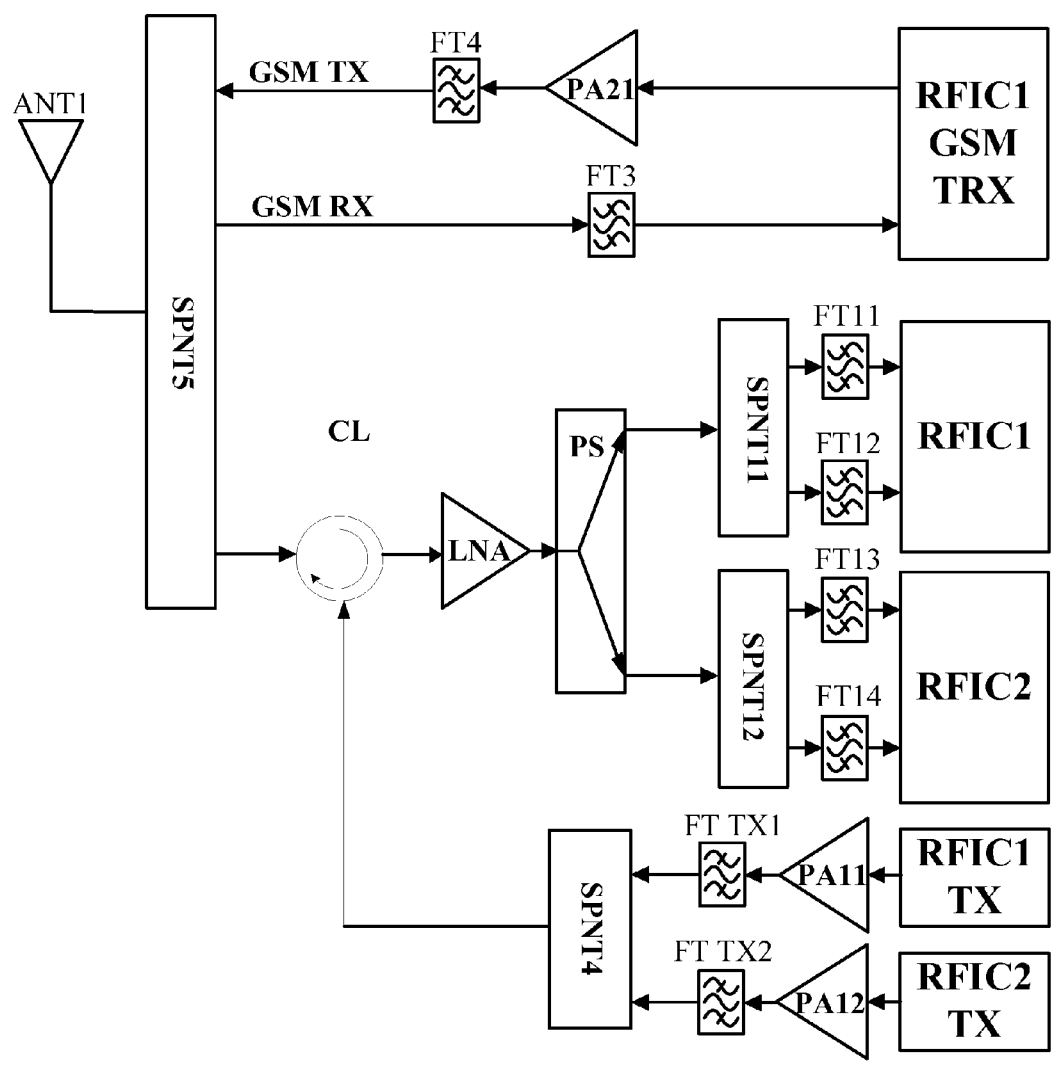
FIG. 6 is a schematic structural diagram of Embodiment 6 of a radio frequency channel according to the present invention.

FIG. 6 is a schematic structural diagram of Embodiment 6 of a radio frequency channel according to the present invention. As shown in FIG. 6, based on the radio frequency channel described in FIG. 5, this radio frequency channel further includes: a third filter (FT3), a fourth filter (FT4), a second power amplifier (PA21), a fifth single-pole, n-throw switch (SPNT5), and a third radio frequency chip (RIFC1 GSM TRX).

The radio frequency channel provided in this embodiment supports a global system for mobile (Global System for Mobile, GSM for short) standard.

During a GSM signal receiving process, the fifth single-pole, n-throw switch (SPNT5) receives a third radio frequency signal (a GSM standard signal) transmitted by the first antenna (ANT1), and connects the third radio frequency signal to the third filter (FT3); the third filter (FT3) filters the third radio frequency signal and transmits the filtered third radio frequency signal to the third radio frequency chip (RIFC1 GSM TRX); and the third radio frequency chip (RIFC1 GSM TRX) demodulates the filtered third radio frequency signal.

During a GSM signal transmitting process, the third radio frequency chip (RIFC1 GSM TRX) modulates a second analog baseband/intermediate-frequency signal into a fourth radio frequency signal, and transmits the fourth radio frequency signal to the second power amplifier (PA21); the second power amplifier (PA21) amplifies the fourth radio frequency signal to obtain the amplified fourth radio frequency signal, and transmits the amplified fourth radio frequency signal to the fourth filter (FT4); the fourth filter (FT4) filters the fourth radio frequency signal and transmits the filtered fourth radio frequency signal to the fifth single-pole, n-throw switch (SPNT 5); and the fifth single-pole, n-throw switch (SPNT 5) connects the filtered fourth radio frequency signal to the first antenna (ANT1).

It should be noted that a radio frequency front-end of a mobile terminal is mainly classified into two parts: a receive channel and a transmit channel. The receive channel receives a radio signal from a radio channel, converts the radio signal into an analog baseband/intermediate-frequency signal, and transmits the analog baseband/intermediate-frequency signal to a baseband processor. The transmit channel receives the analog baseband/intermediate-frequency signal from the baseband processor, and transmits the analog baseband/intermediate-frequency signal to the radio channel. The receive channel includes a primary receive channel and a diversity receive channel, structures of which may be the same or different. The radio frequency channel shown in FIG. 1 to FIG. 3 in the embodiments may be a primary receive channel and a diversity receive channel, and the radio frequency channel shown in FIG. 4 is a transmit channel. Based on the embodiments in FIG. 1 to FIG. 5, the following describes an architecture of a radio frequency front-end in detail.

Before a radio frequency front-end described in FIG. 7 to FIG. 14 is explained, some reference numerals in FIG. 7 to FIG. 14 are explained as follows:

For a primary receive channel, ANT 1P represents an antenna of the primary receive channel, namely, a structure of the first antenna in FIG. 1 to FIG. 3; PRX represents the primary receive channel; and RFIC1 PRX and RIFC2 PRX represent radio frequency chips, which are on the primary receive channel and whose function is equivalent to that of the first radio frequency chip.

For a diversity receive channel, ANT 1D represents an antenna of the diversity receive channel, namely, the structure of the first antenna in FIG. 1 to FIG. 3; DRX represents the diversity receive channel; and RIFC1 DRX and RIFC2 DRX represent radio frequency chips, which are on the diversity receive channel and whose function is equivalent to that of the first radio frequency chips.

For a transmit channel, ANT TX represents an antenna of the transmit channel, namely, a structure of the second antenna in FIG. 4; TX represents the transmit channel; and RIFC1 TX and RIFC2 TX represent radio frequency chips of the transmit channel, namely, the second radio frequency chips.

Refer to the embodiments in FIG. 1 to FIG. 6 for definitions of other reference numerals in FIG. 7 to FIG. 14, which are not described herein again.

Figure 7:
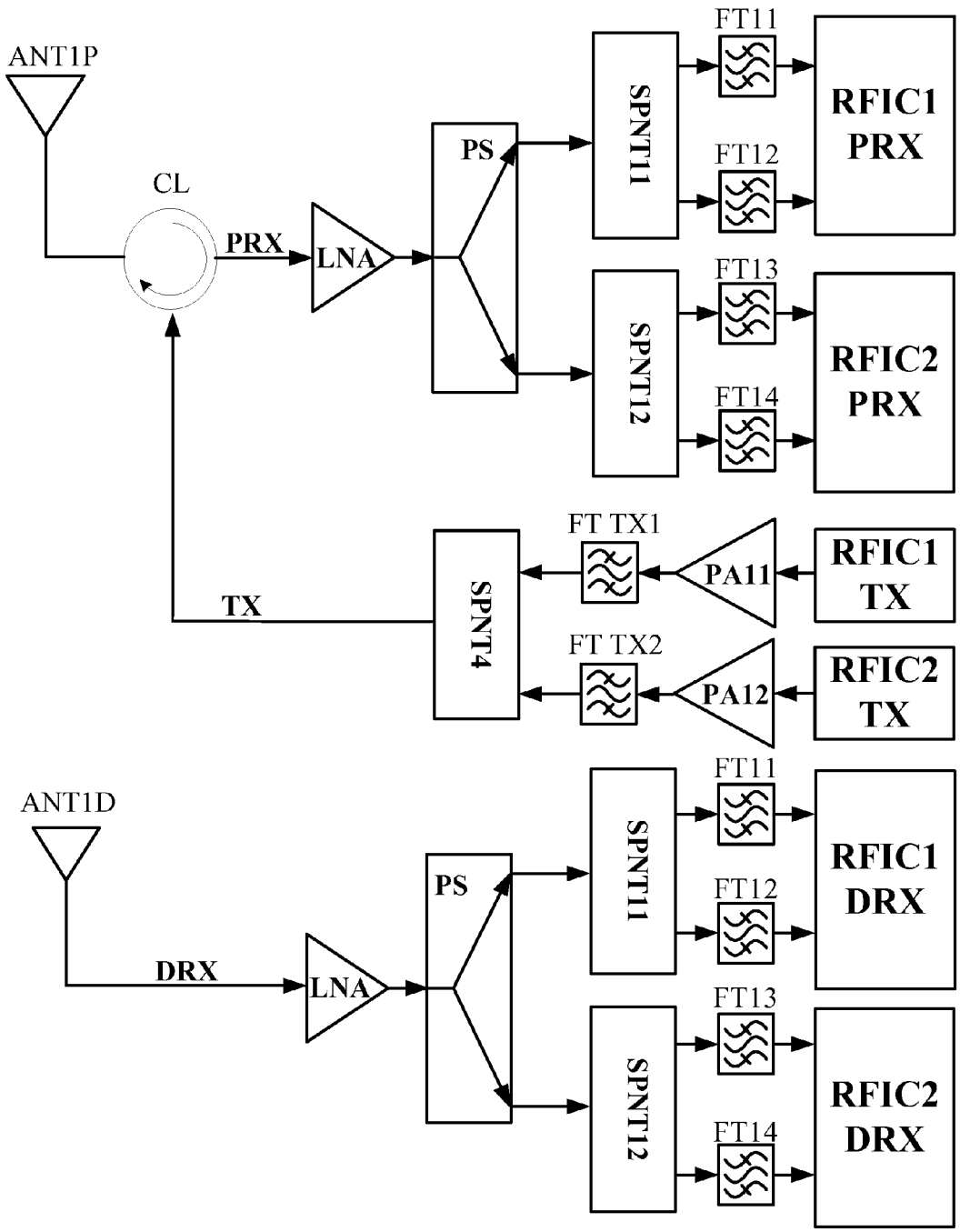
FIG. 7 is a schematic structural diagram of Embodiment 1 of a radio frequency front-end according to the present invention.

FIG. 7 is a schematic structural diagram of Embodiment 1 of a radio frequency front-end according to the present invention. As shown in FIG. 7, the radio frequency front-end includes a primary receive channel PRX, a diversity receive channel DRX, and a transmit channel TX. The primary receive channel PRX and the transmit channel TX are connected by using a circulator CL, and a structure in FIG. 7 is similar to a structure of the radio frequency channel in the embodiment shown in FIG. 6. A structure of the diversity receive channel DRX is similar to a structure of the radio frequency channel in the embodiment shown in FIG. 1. Refer to the embodiments in FIG. 1 to FIG. 6 for a specific implementation principle of each channel, which is not described herein again in this embodiment.

Figure 8:
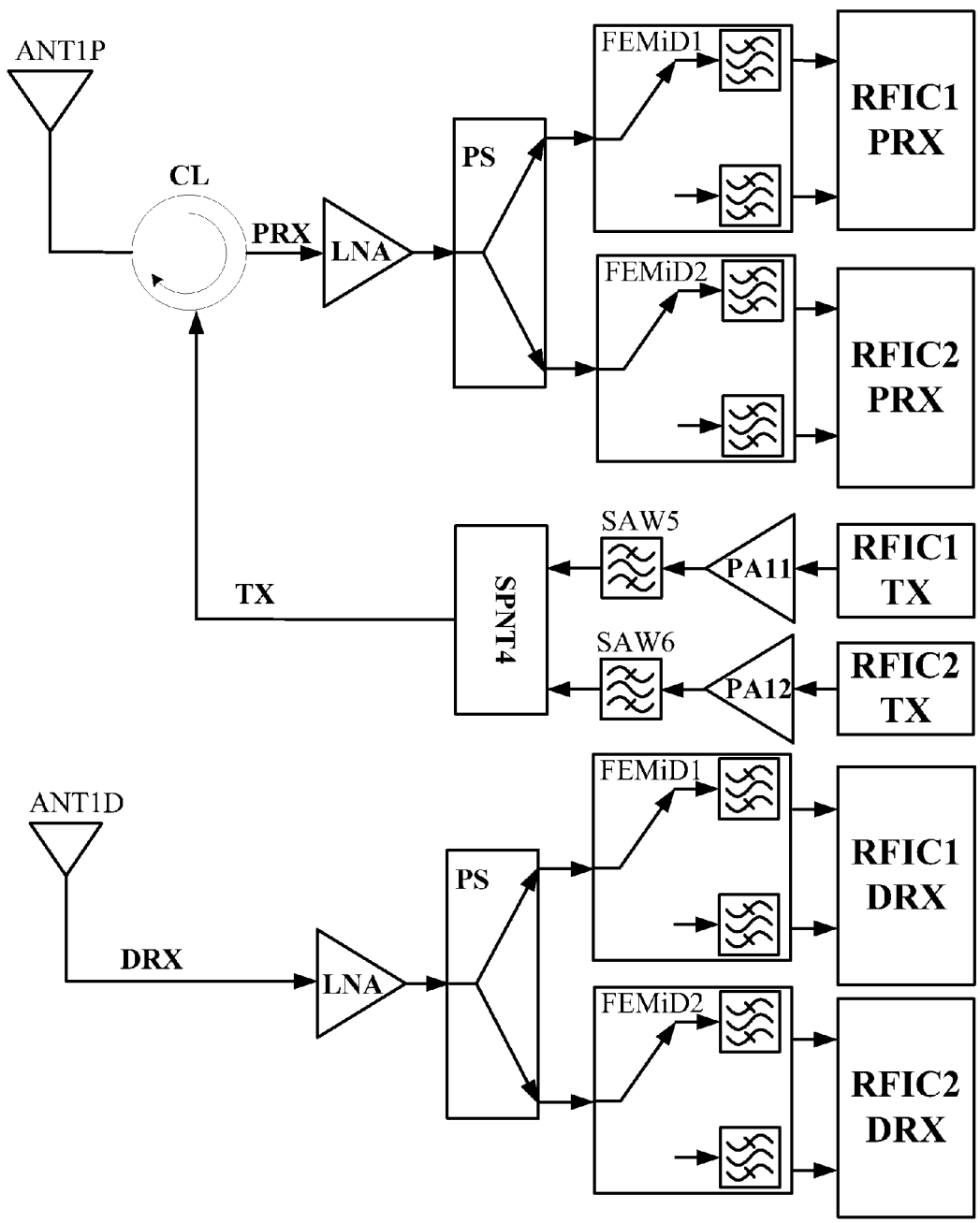
FIG. 8 is a schematic structural diagram of Embodiment 2 of a radio frequency front-end according to the present invention.

FIG. 8 is a schematic structural diagram of Embodiment 2 of a radio frequency front-end according to the present invention. The radio frequency front-end includes a primary receive channel PRX, a diversity receive channel DRX, and a transmit channel TX. The primary receive channel PRX and the transmit channel TX are connected by using a circulator CL. Structures of the primary receive channel PRX and the diversity receive channel DRX are similar to a structure of the radio frequency channel shown in the embodiment in FIG. 3, and a structure of the transmit channel is similar to a structure of the transmit channel in the embodiment in FIG. 8. Refer to the embodiments in FIG. 1 to FIG. 6 for a specific implementation principle of each channel, which is not described herein again in this embodiment.

Figure 9:
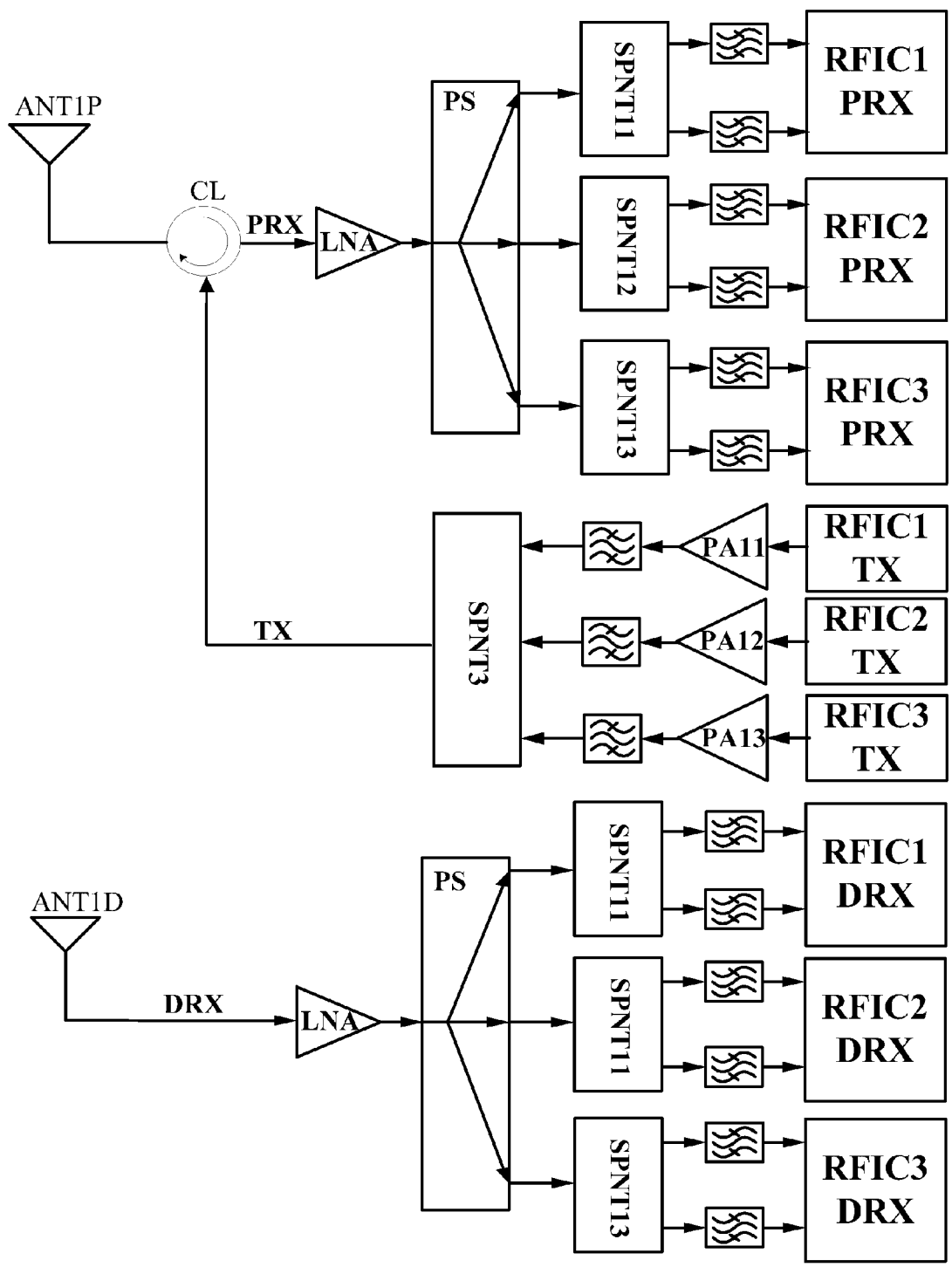
FIG. 9 is a schematic structural diagram of Embodiment 3 of a radio frequency front-end according to the present invention.

FIG. 9 is a schematic structural diagram of Embodiment 3 of a radio frequency front-end according to the present invention. As shown in FIG. 9, based on the embodiment in FIG. 7, in this embodiment, a power divider PS divides a radio frequency signal into three signals. A channel is added to a primary receive channel, and correspondingly a first single-pole, n-throw switch (SPNT13) and a first radio frequency chip (RFIC3 PRX) are added. A channel is added to a diversity receive channel, and correspondingly a first single-pole, n-throw switch (SPNT13) and a first radio frequency chip (RFIC3 DRX) are added. A channel is added to a transmit channel, and correspondingly a PA13 and a second radio frequency chip (RFIC3 TX) are added. The radio frequency front-end in this embodiment is configured to implement a third single-carrier signal of CA. By using the radio frequency front-end, a CA technology in which three single-carrier signals are aggregated can be implemented. A difference between this embodiment and that a power divider divides a radio frequency signal into two signals lies in that the power divider divides a received signal into three signals, which are filtered by using respective filters of corresponding frequency bands. By increasing channels of the power divider, a three-carrier CA technology is implemented. If the number of channels of the power divider continues to be increased, a four-carrier CA technology, a five-carrier CA technology, and a CA technology of even more carriers can be implemented.

Figure 10:
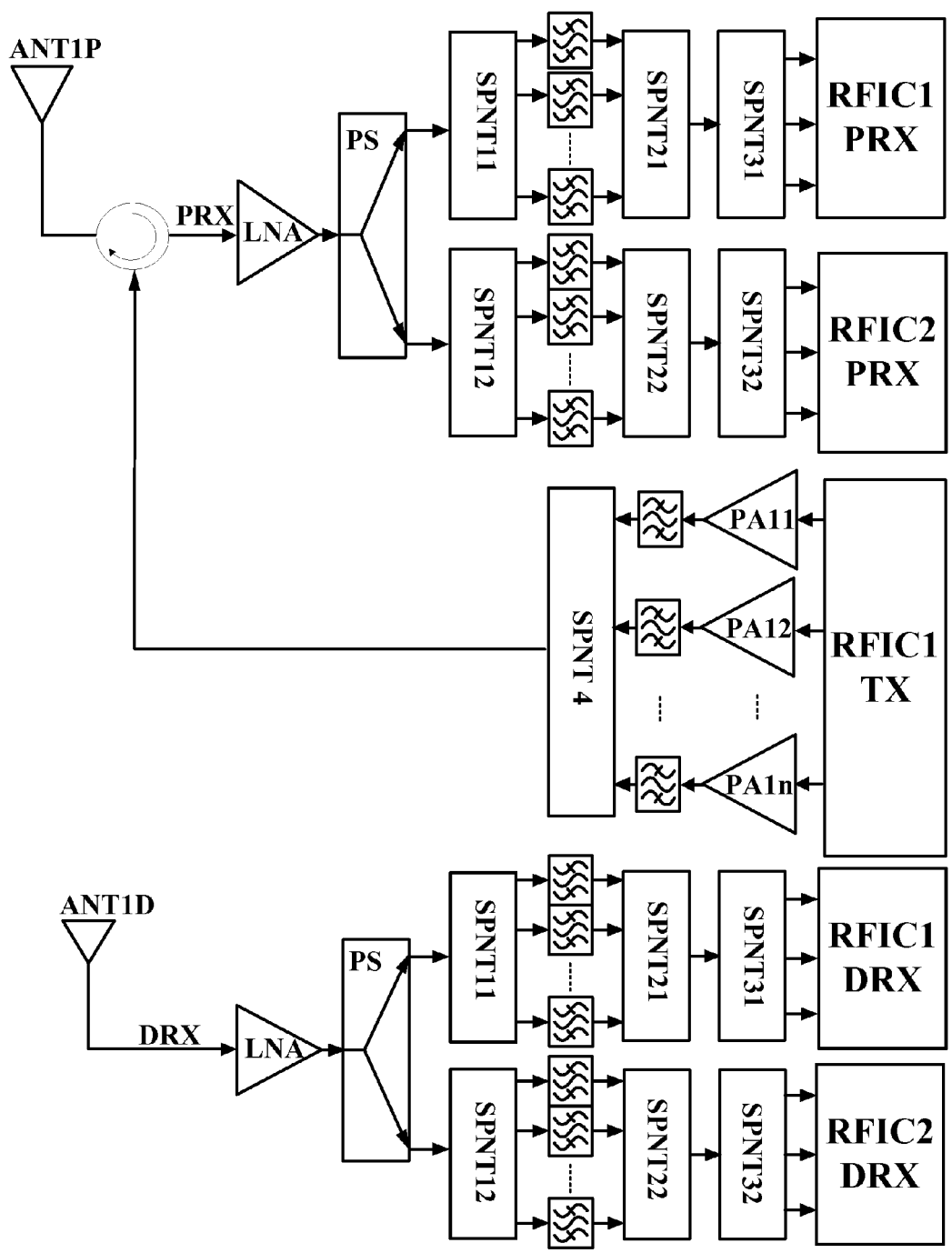
FIG. 10 is a schematic structural diagram of Embodiment 4 of a radio frequency front-end according to the present invention.

FIG. 10 is a schematic structural diagram of Embodiment 4 of a radio frequency front-end according to the present invention. The radio frequency front-end includes a primary receive channel PRX, a diversity receive channel DRX, and a transmit channel TX. The primary receive channel PRX and the transmit channel TX are connected by using a circulator CL. In the radio frequency front-end, structures of the primary receive channel PRX and the diversity receive channel DRX are similar to a structure of the radio frequency channel in the embodiment shown in FIG. 2, and a structure of the transmit channel TX is similar to a structure of the radio frequency channel described in FIG. 4. Refer to the embodiments in FIG. 1 to FIG. 6 for a specific implementation principle of each channel, which is not described herein again.

Figure 11:
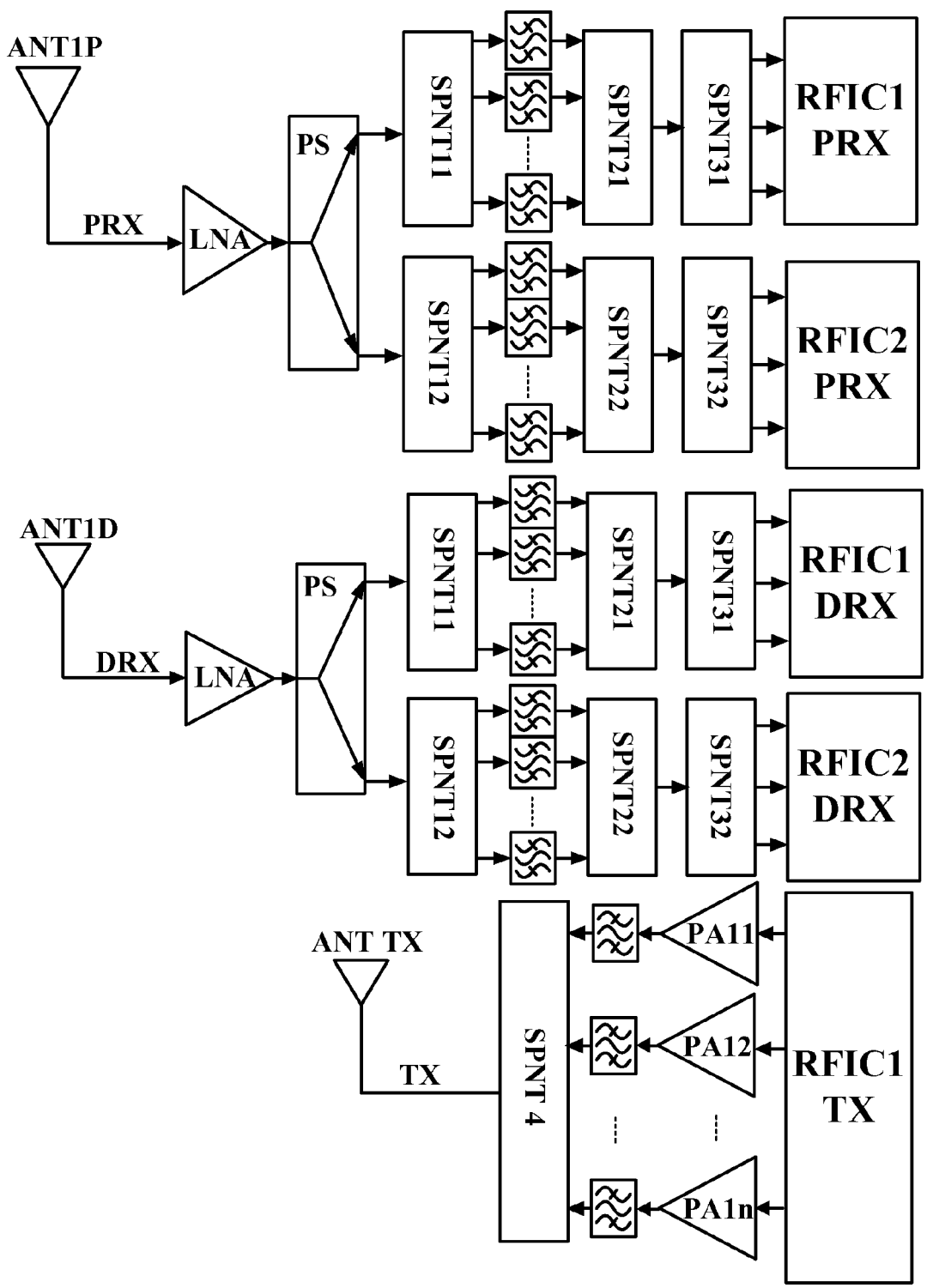
FIG. 11 is a schematic structural diagram of Embodiment 5 of a radio frequency front-end according to the present invention.

FIG. 11 is a schematic structural diagram of Embodiment 5 of a radio frequency front-end according to the present invention. The radio frequency front-end includes a primary receive channel PRX, a diversity receive channel DRX, and a transmit channel TX. Based on the radio frequency front-end described in FIG. 10, in this radio frequency front-end, the primary receive channel and the transmit channel are separated, no circulator is used as a duplexer; instead, the primary receive channel and the transmit channel each use an antenna.

Figure 12:
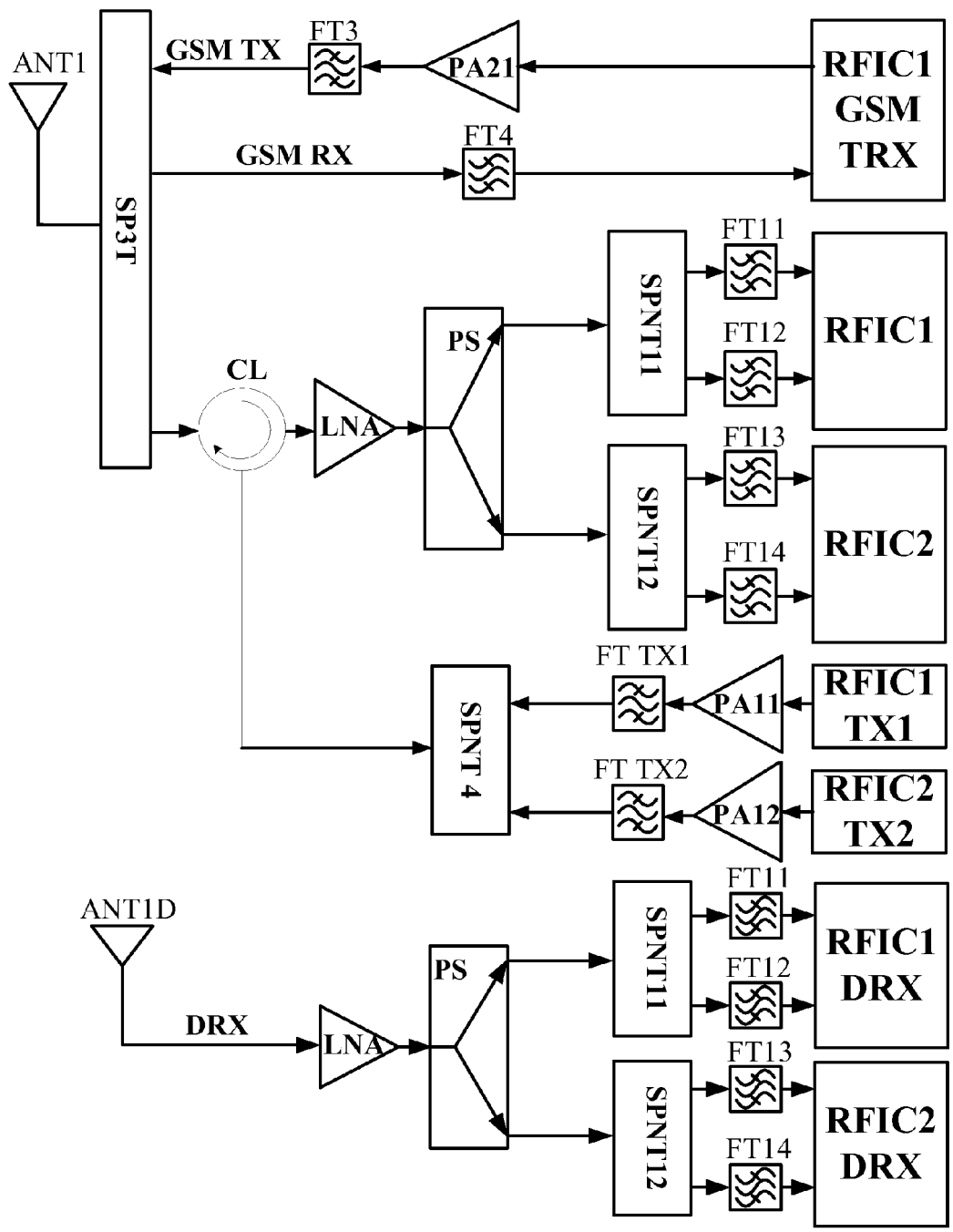
FIG. 12 is a schematic structural diagram of Embodiment 6 of a radio frequency front-end according to the present invention.

FIG. 12 is a schematic structural diagram of Embodiment 6 of a radio frequency front-end according to the present invention. The radio frequency front-end includes a primary receive channel PRX, a diversity receive channel DRX, and a transmit channel TX. The primary receive channel PRX and the transmit channel TX are connected by using a circulator CL. Structures of the primary receive channel PRX and the transmit channel TX are similar to those in the embodiment in FIG. 5, and a structure of the diversity receive channel DRX is similar to that of the radio frequency channel shown in the embodiment in FIG. 1. Refer to the embodiments in FIG. 1 to FIG. 6 for a specific implementation principle of each channel, which is not described herein again.

Figure 13:
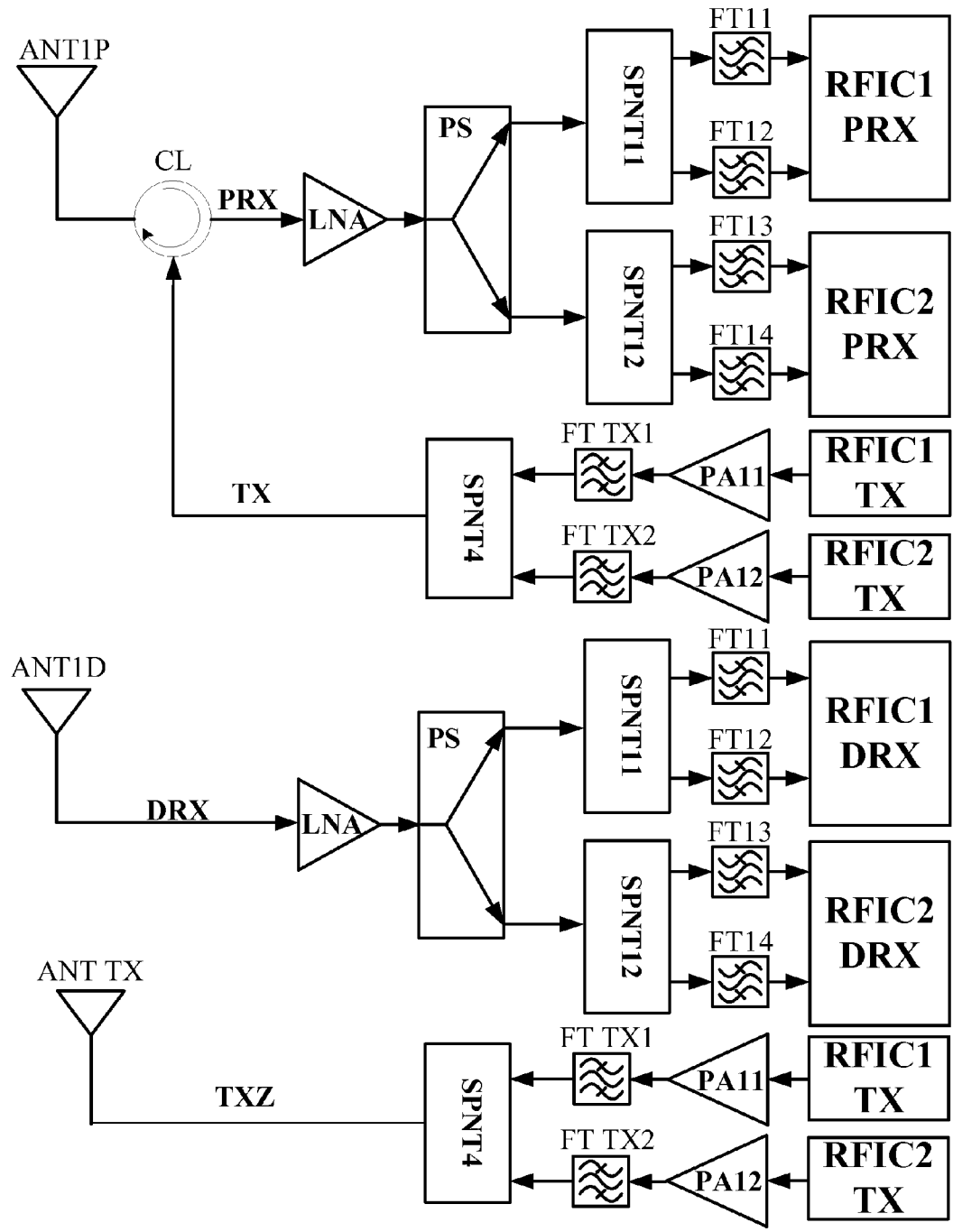
FIG. 13 is a schematic structural diagram of Embodiment 7 of a radio frequency front-end according to the present invention.

FIG. 13 is a schematic structural diagram of Embodiment 7 of a radio frequency front-end according to the present invention. Based on the radio frequency channel described in FIG. 7, on this radio frequency channel, a transmit channel TXZ is added with a structure and a working principle similar to those in the embodiment in FIG. 4, and is configured to concurrently increase uplink traffic.

Figure 14:
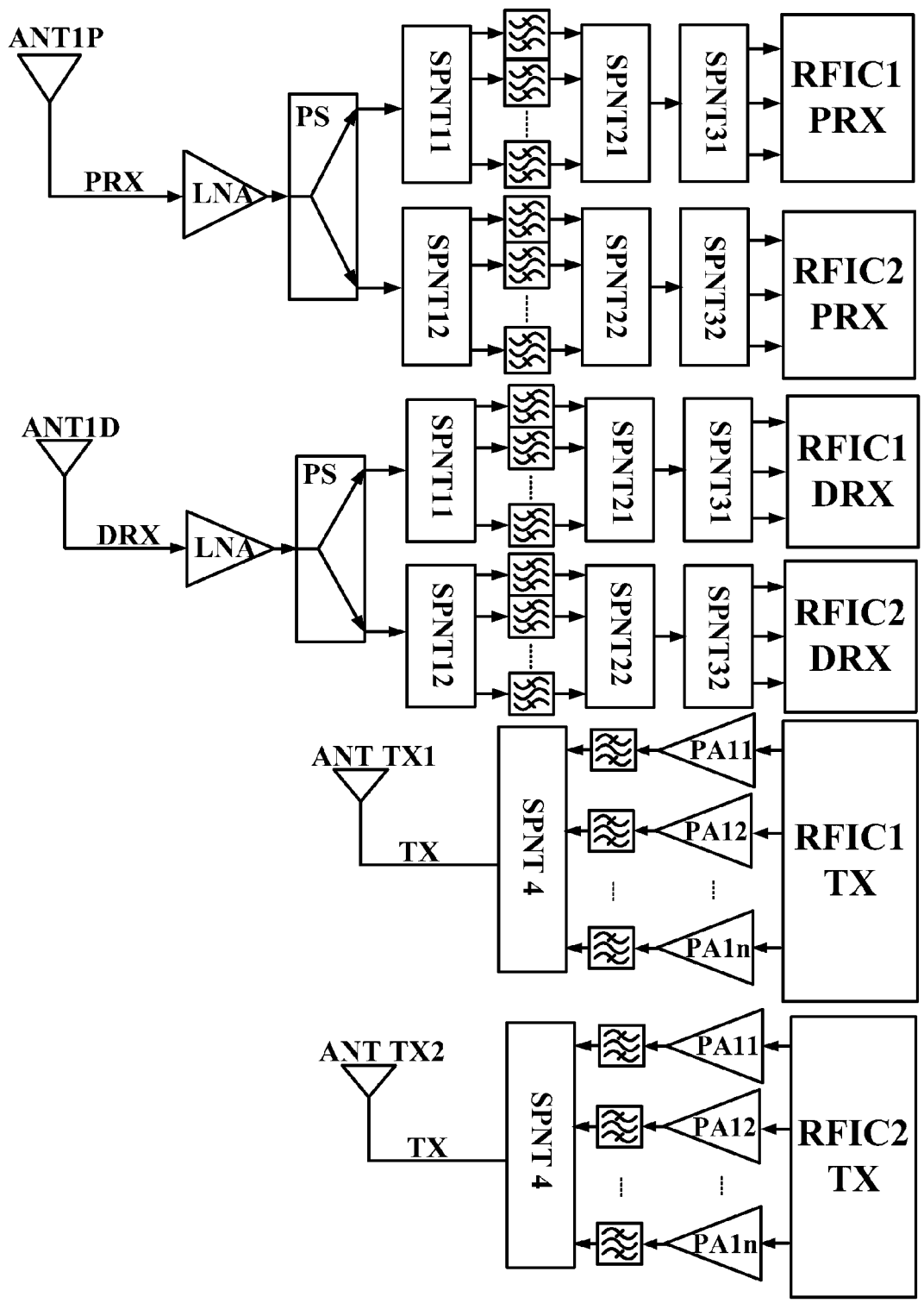
FIG. 14 is a schematic structural diagram of Embodiment 8 of a radio frequency front-end according to the present invention.

FIG. 14 is a schematic structural diagram of Embodiment 8 of a radio frequency front-end according to the present invention. Based on the radio frequency channel described in FIG. 11, on this radio frequency channel, a transmit channel corresponding to a transmit antenna ANT TX2 is added with a structure and a working principle similar to those in the embodiment in FIG. 4, and is configured to concurrently increase uplink traffic.

Persons skilled in the art may understand that the radio frequency front-end described in the present invention can support a total of six CA technologies. The radio frequency front-ends listed in the foregoing embodiments are only for exemplary explanation. During a specific implementation process, variations may be made to obtain radio frequency front-ends of other structures according to the radio frequency channels in FIG. 1 to FIG. 6 and the radio frequency front-ends in FIG. 7 to FIG. 14. The structures of the radio frequency front-ends are not enumerated herein in the present invention.

It should be noted that on the radio frequency channel or in the radio frequency front-end described in any embodiment of the present invention, the radio frequency channel or the radio frequency front-end may further include a baseband processing unit. The baseband processing unit is coupled to each first radio frequency chip and is configured to process a baseband/intermediate-frequency signal generated after each first radio frequency chip performs demodulation. Further, the baseband processing unit is further configured to generate a control signal of first single-pole, n-throw switches to control connection or switching-off of each of the first single-pole, n-throw switches.

It should still be noted that on the radio frequency channel or in the radio frequency front-end described in any embodiment of the present invention, a first radio frequency chip further includes a down-converter for signal demodulation, and a second radio frequency chip further includes an up-converter for signal modulation. The down-converter is configured to complete conversion from a radio frequency signal into an intermediate-frequency/baseband signal, and the up-converter is configured to complete conversion from an intermediate-frequency/baseband signal into a radio frequency signal.

In addition, LTE is used as an example for explanation in the embodiments of the present invention, but the LTE technology mentioned in the embodiments of the present invention may also be replaced with another radio communications standard, such as wide band code division multiple access (Wide band Code Division Multiple Access, WCDMA for short) or code division multiple access 2000 (Code Division Multiple Access 2000, CDMA2000 for short).

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A radio frequency channel, comprising: a first antenna, a low noise amplifier, a power divider, at least two first single-pole, n-throw switches, at least four first filters, and at least two first radio frequency chips, at least two second single-pole, n-throw switches and at least two third single-pole, n-throw switches, wherein each of the at least four first filters corresponds to a filtering band;

wherein the first antenna receives a first radio frequency signal and transmits the first radio frequency signal to the low noise amplifier;

the low noise amplifier amplifies the first radio frequency signal and transmits the amplified first radio frequency signal to the power divider;

the power divider divides the amplified first radio frequency signal into at least two first radio frequency sub-signals and separately transmits each of the first radio frequency sub-signals to one of the at least two first single-pole, n-throw switches, wherein the at least two first single-pole, n-throw switches are characterized by single-input multi-output;

each of the at least two first single-pole, n-throw switches connects a received first radio frequency sub-signal to at least two first filters of the at least four first filters;

the at least two first filters filter the received first radio frequency sub-signals to obtain at least two filtered first radio frequency sub-signals, and transmit the at least two filtered first radio frequency sub-signals to one of the at least two first radio frequency chips; and the one of the at least two first radio frequency chips demodulates the at least two filtered first radio frequency sub-signals, the at least two first filters transmit the at least two filtered first radio frequency sub-signals to one of the at least two second single-pole, n-throw switches, and the at least two second single-pole, n-throw switches are characterized by multi-input single-output;

one of the at least two second single-pole, n-throw switches connects the at least two filtered first radio frequency sub-signals to one of the at least two third single-pole, n-throw switches, and the at least two third single-pole, n-throw switches are characterized by single-input multi-output; and one of the at least two third single-pole, n-throw switches transmits received first radio frequency sub-signals to one of the at least two first radio frequency chips.

2. The radio frequency channel according to claim 1, wherein each of the first single-pole, n-throw switches and the at least two first filters corresponding to the first single-pole, n-throw switch are integrally set.

3. The radio frequency channel according to claim 1, further comprising: a second antenna, a fourth single-pole, n-throw switch, at least two second filters, at least two first power amplifiers, and at least two second radio frequency chips, wherein each of the at least two second filters corresponds to a filtering band;

the at least two second radio frequency chips modulate a first analog baseband or an intermediate-frequency signal into at least two second radio frequency signals, and transmit the at least two second radio frequency signals to the at least two first power amplifiers;

the at least two first power amplifiers amplify the at least two second radio frequency signals to obtain at least two amplified second radio frequency signals, and transmit the at least two amplified second radio frequency signals to the at least two second filters;

the at least two second filters filter the at least two amplified second radio frequency signals to obtain at least two filtered second radio frequency signals, and transmit the at least two filtered second radio frequency signals to the fourth single-pole, n-throw switch; and the fourth single-pole, n-throw switch connects the at least two filtered second radio frequency signals to the second antenna.

4. The radio frequency channel according to claim 3, wherein each of the second radio frequency chips comprises: an up-converter for signal modulation.

5. The radio frequency channel according to claim 1, wherein the radio frequency channel further comprises: a circulator, a fourth single-pole, n-throw switch, at least two second filters, at least two first power amplifiers, and at least two second radio frequency chips, wherein each of the at least two second filters corresponds to a filtering band;

the circulator is disposed between the first antenna and the low noise amplifier;

the at least two second radio frequency chips modulate a first analog baseband or an intermediate-frequency signal into at least two second radio frequency signals, and transmit the at least two second radio frequency signals to the at least two first power amplifiers;

the at least two first power amplifiers amplify the at least two second radio frequency signals to obtain at least two amplified second radio frequency signals, and transmit the at least two amplified second radio frequency signals to the at least two second filters;

the at least two second filters filter the at least two amplified second radio frequency signals to obtain at least two filtered second radio frequency signals, and transmit the at least two filtered second radio frequency signals to the fourth single-pole, n-throw switch;

the fourth single-pole, n-throw switch connects the at least two filtered second radio frequency signals to the first antenna using the circulator; and the first antenna receives the first radio frequency signal and transmits the first radio frequency signal to the low noise amplifier using the circulator.

6. The radio frequency channel according to claim 5, further comprising: a third filter, a fourth filter, a second power amplifier, a fifth single-pole, n-throw switch, and a third radio frequency chip;

the fifth single-pole, n-throw switch receives a third radio frequency signal transmitted by the first antenna, and connects the third radio frequency signal to the third filter;

the third filter filters the third radio frequency signal and transmits the filtered third radio frequency signal to the third radio frequency chip;

the third radio frequency chip demodulates the filtered third radio frequency signal;

the third radio frequency chip modulates a second analog baseband or an intermediate-frequency signal into a fourth radio frequency signal, and transmits the fourth radio frequency signal to the second power amplifier;

the second power amplifier amplifies the fourth radio frequency signal to obtain the amplified fourth radio frequency signal, and transmits the amplified fourth radio frequency signal to the fourth filter;

the fourth filter filters the fourth radio frequency signal and transmits the filtered fourth radio frequency signal to the fifth single-pole, n-throw switch; and the fifth single-pole, n-throw switch connects the filtered fourth radio frequency signal to the first antenna.

7. The radio frequency channel according to claim 1, further comprising: a baseband processing unit, coupled to each of the first radio frequency chips, and configured to process a baseband or an intermediate-frequency signal generated after each of the first radio frequency chips performs demodulation.

8. The radio frequency channel according to claim 7, wherein the baseband processing unit is further configured to generate a control signal of the first single-pole, n-throw switches to control connection or switching-off of each of the first single-pole, n-throw switches.

9. The radio frequency channel according to claim 1, wherein each of the first radio frequency chips comprises: a down-converter for signal demodulation.

10. A method implemented by a radio frequency channel, wherein the radio frequency channel comprises. a first antenna, a low noise amplifier, a power divider, at least two first single-pole, n-throw switches, at least four first filters, and at least two first radio frequency chips, wherein each of the at least four first filters corresponds to a filtering band; at least two second single-pole, n-throw switches and at least two third single-pole, n-throw switches, the method comprising:

receiving, by the first antenna, a first radio frequency signal, and transmitting the first radio frequency signal to the low noise amplifier;

amplifying, by the low noise amplifier, the first radio frequency signal and transmitting the amplified first radio frequency signal to the power divider;

dividing, by the power divider, the amplified first radio frequency signal into at least two first radio frequency sub-signals and separately transmitting each of the first radio frequency sub-signals to one of the at least two first single-pole, n-throw switches, wherein the at least two first single-pole, n-throw switches are characterized by single-input multi-output;

wherein each of the at least two first single-pole, n-throw switches connects a received first radio frequency sub-signal to at least two first filters of the at least four first filters;

filtering, by the at least two first filters, the received first radio frequency sub-signals to obtain at least two filtered first radio frequency sub-signals, and transmitting the at least two filtered first radio frequency sub-signals to one of the at least two first radio frequency chips; and demodulating, by the one of the at least two first radio frequency chips, the at least two filtered first radio frequency sub-signals, transmitting, by the at least two first filters, the at least two filtered first radio frequency sub-signals to one of the at least two second single-pole, n-throw switches, and wherein the at least two second single-pole, n-throw switches are characterized by multi-input single-output;

wherein one of the at least two second single-pole, n-throw switches connects the at least two filtered first radio frequency sub-signals to one of the at least two third single-pole, n-throw switches, and the at least two third single-pole, n-throw switches are characterized by single-input multi-output; and transmitting, by one of the at least two third single-pole, n-throw switches, received first radio frequency sub-signals to one of the at least two first radio frequency chips.

11. The method according to claim 10, wherein each of the first single-pole, n-throw switches and the at least two first filters corresponding to the first single-pole, n-throw switch are integrally set.

12. The method according to claim 10, wherein the radio frequency channel further comprises: a second antenna, a fourth single-pole, n-throw switch, at least two second filters, at least two first power amplifiers, and at least two second radio frequency chips, wherein each of the at least two second filters corresponds to a filtering band, and the method further comprising:

modulating, by the at least two second radio frequency chips, a first analog baseband or an intermediate-frequency signal into at least two second radio frequency signals, and transmitting the at least two second radio frequency signals to the at least two first power amplifiers;

amplifying, by the at least two first power amplifiers, the at least two second radio frequency signals to obtain at least two amplified second radio frequency signals, and transmitting the at least two amplified second radio frequency signals to the at least two second filters;

filtering, by the at least two second filters, the at least two amplified second radio frequency signals to obtain at least two filtered second radio frequency signals, and transmitting the at least two filtered second radio frequency signals to the fourth single-pole, n-throw switch; and connecting, by the fourth single-pole, n-throw switch, the at least two filtered second radio frequency signals to the second antenna.

13. The method according to claim 12, wherein each of the second radio frequency chips comprises: an up-converter for signal modulation.

14. The method according to claim 10, wherein the radio frequency channel further comprises: a circulator, a fourth single-pole, n-throw switch, at least two second filters, at least two first power amplifiers, and at least two second radio frequency chips, wherein each of the at least two second filters corresponds to a filtering band; the circulator is disposed between the first antenna and the low noise amplifier, and the method further comprising:

modulating, by the at least two second radio frequency chips, a first analog baseband or an intermediate-frequency signal into at least two second radio frequency signals, and transmitting the at least two second radio frequency signals to the at least two first power amplifiers;

amplifying, by the at least two first power amplifiers, the at least two second radio frequency signals to obtain at least two amplified second radio frequency signals, and transmitting the at least two amplified second radio frequency signals to the at least two second filters;

filtering, by the at least two second filters, the at least two amplified second radio frequency signals to obtain at least two filtered second radio frequency signals, and transmitting the at least two filtered second radio frequency signals to the fourth single-pole, n-throw switch;

connecting, by the fourth single-pole, n-throw switch, the at least two filtered second radio frequency signals to the first antenna using the circulator; and receiving, by the first antenna, the first radio frequency signal and transmitting the first radio frequency signal to the low noise amplifier using the circulator.

15. The method according to claim 14, wherein the radio frequency channel further comprises: a third filter, a fourth filter, a second power amplifier, a fifth single-pole, n-throw switch, and a third radio frequency chip, and the method further comprising:

receiving, by the fifth single-pole, n-throw switch, a third radio frequency signal transmitted by the first antenna, and connecting the third radio frequency signal to the third filter;

filtering, by the third filter, the third radio frequency signal and transmitting the filtered third radio frequency signal to the third radio frequency chip;

demodulating, by the third radio frequency chip, the filtered third radio frequency signal;

modulating, by the third radio frequency chip, a second analog baseband or an intermediate-frequency signal into a fourth radio frequency signal, and transmitting the fourth radio frequency signal to the second power amplifier;

amplifying, by the second power amplifier, the fourth radio frequency signal to obtain the amplified fourth radio frequency signal, and transmitting the amplified fourth radio frequency signal to the fourth filter;

filtering, by the fourth filter, the fourth radio frequency signal, and transmitting the filtered fourth radio frequency signal to the fifth single-pole, n-throw switch; and connecting, by the fifth single-pole, n-throw switch, the filtered fourth radio frequency signal to the first antenna.

16. The method according to claim 10, wherein the radio frequency channel further comprises: a baseband processing unit, coupled to each of the first radio frequency chips, and the method further comprises: process, by the baseband processing unit, a baseband or an intermediate-frequency signal generated after each of the first radio frequency chips performs demodulation.

17. The method according to claim 16, further comprising: generating, by the baseband processing unit, a control signal of the first single-pole, n-throw switches to control connection or switching-off of each of the first single-pole, n-throw switches.

18. The method according to claim 10, wherein each of the first radio frequency chips comprises: a down-converter for signal demodulation.

* * * * *